(12) United States Patent
Usami (10) Patent No.: US 9,457,479 B2
(45) Date of Patent: *Oct. 4, 2016

(54) TRANSPORT DEVICE (71) Applicant: DAIFUKU CO., LTD., Osaka-shi, Osaka (JP)

(72) Inventor: Makoto Usami, Shiga (JP)

(73) Assignee: DAIFUKU CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/715,853

(22) Filed: May 19, 2015

(65) Prior Publication Data

US 2015/0336279 A1 Nov. 26, 2015

(30) Foreign Application Priority Data

May 22, 2014 (JP) ................................ 2014-105739

(51) Int. Cl.
| | | |
|---|---|---|
| *B66C 1/42* | (2006.01) | |
| *B25J 15/10* | (2006.01) | |
| *B25J 15/00* | (2006.01) | |
| *B25J 19/02* | (2006.01) | |
| *H01L 21/67* | (2006.01) | |
| *H01L 21/673* | (2006.01) | |
| *H01L 21/677* | (2006.01) | |

(Continued)

(52) U.S. Cl.
CPC ............. *B25J 15/10* (2013.01); *B25J 15/0028* (2013.01); *B25J 19/02* (2013.01); *H01L 21/6773* (2013.01); *H01L 21/67259* (2013.01); *H01L 21/67346* (2013.01); *H01L 21/67733* (2013.01); *H01L 21/68* (2013.01); *H01L 21/68707* (2013.01)

(58) Field of Classification Search
CPC .... B25J 15/00; B25J 15/0009; B25J 15/026; B25J 15/0253; B25J 15/10; B25J 15/0028; B25J 19/02; A01D 87/003; B25B 9/00; B66C 1/24; B66F 9/181; B66F 9/183; B66F 9/18; B66F 9/188; B66F 9/195; B65G 57/00; B65G 57/18; B65G 61/00; B65H 31/30; H01L 21/67259; H01L 21/67346; H01L 21/6773; H01L 21/67733; H01L 21/68; H01L 21/68707; B65B 5/068
USPC ...................................................... 294/119.1
See application file for complete search history.

(56) References Cited

U.S. PATENT DOCUMENTS

| | | | | |
|---|---|---|---|---|
| 4,852,928 A | * | 8/1989 | Monforte | ............... B25J 13/082 294/119.1 |
| 5,017,075 A | * | 5/1991 | Block | ................... B65G 37/00 19/65 A |

(Continued)

FOREIGN PATENT DOCUMENTS

JP        2004-025427          1/2004      ............. B25J 15/08

*Primary Examiner* — Stephen Vu
(74) *Attorney, Agent, or Firm* — Kusner & Jaffe (57) ABSTRACT

A transport device that can transport stacked articles to be transported without changing a device configuration and can correct and prevent a displacement of the stacked articles to be transported with a simple device configuration. A chucking device is provided to hold trays in a stacked state. The chucking device is provided with an overhead carriage for transporting the trays held by the chucking device. The chucking device includes a holding unit that holds the trays and sensors that detect the trays held by the holding unit. The holding unit is configured such that the holding operation of the holding unit on the trays is controlled based on detection of the sensors, and correct and prevent a displacement of the stacked trays.

4 Claims, 6 Drawing Sheets (51) Int. Cl.
 *H01L 21/68* (2006.01)
 *H01L 21/687* (2006.01)

(56) References Cited

U.S. PATENT DOCUMENTS 5,150,937 A * 9/1992 Yakou .................... B25J 9/1612
 294/119.1

6,592,324 B2 * 7/2003 Downs ................. B25J 15/0253
 294/104
7,887,108 B1 * 2/2011 Cawley .................. B25J 15/022
 294/106
7,938,614 B2 * 5/2011 Fritzsche ............... B65G 57/06
 414/622
8,267,451 B2 * 9/2012 Pedrazzini ............. B25J 13/088
 294/119.1

* cited by examiner

TRANSPORT DEVICE

RELATED APPLICATIONS

This application claims priority from Japanese Patent Application No. 2014-105739, filed with the Japanese Patent Office on May 22, 2014, the entire content of which is hereby incorporated by reference.

FIELD OF THE INVENTION

The present invention relates to a transport device that transports works such as a semiconductor substrate or articles to be transported, for example, transport containers that accommodate works in a stacked state.

BACKGROUND OF THE INVENTION

Conventionally, in production facilities for semiconductor devices and so on, articles to be transported, for example, transport containers that contain works such as semiconductor substrates may be sequentially transported between multiple processing units while being held by overhead carriages (transport devices) that travel along a traveling rail provided near the ceiling of a facility.

For example, Japanese Patent Laid-Open No. 2004-25427 discloses a transport device that transports works to processing units while traveling between the processing units in a clean room. The transport device includes an elevating unit that is provided on a horizontal movement unit and vertically moves a work holding unit for holding a work (enclosed container), transferring the works between the work holding unit and the processing units.

In the transport device of Japanese Patent Laid-Open No. 2004-25427, the work holding unit includes a work holding part extended in a channel shape to two sides of a work (enclosed container). The work holding unit holds the work (enclosed container) with opposed hands provided on the lower ends of two sides of the work holding part so as to hold the bottom of the work.

In production facilities for semiconductor devices and so on, articles to be transported, for example, transport containers that accommodate works such as semiconductor substrates may be transported (in a stacked state) in which the multiple articles to be transported are stacked. Specifically, a plurality of plate-like pallets (transport containers) accommodating works are stacked and then are transported while being held (grasped) by a transport device.

In transportation of stacked articles to be transported, however, the articles to be transported are not always neatly stacked (in alignment) and thus in some cases, the stacked articles need to be transported without being aligned (out of alignment). Hence, if articles to be transported are stacked without being aligned, unfortunately, the stacked articles to be transported may be insufficiently held (grasped) by a holding (grasping) device. Moreover, the stacked articles to be transported may be disadvantageously displaced and dropped from the transport device during transportation.

Such a problem can be solved by providing an article to be transported with a displacement preventing mechanism for preventing a displacement (for example, articles to be transported may have uneven surfaces that allow engagement between the stacked articles). Unfortunately, the provision of the displacement preventing mechanism for an article to be transported may lead to a complicated configuration. Moreover, some articles to be transported cannot be provided with the displacement preventing mechanism.

Alternatively, the problem can be solved by providing securing members that secure stacked articles to be transported. Articles to be transported need to be secured with the securing members before being transported, disadvantageously leading to low working efficiency.

An object of the present invention is to provide a transport device that can transport, without changing the device configuration, stacked articles to be transported, and can correct and prevent a displacement of the stacked articles with a simple configuration.

SUMMARY OF THE INVENTION

The problems to be solved by the present invention are solved by the following solutions:

A transport device according to a first aspect of the present invention is a transport device including a holding device that holds articles to be transported in a stacked state, the transport device transporting the articles to be transported while being held by the holding device, the holding device including: a holding unit that holds the articles to be transported; and a detecting unit that detects the articles to be transported held by the holding unit, wherein the holding unit is controlled based on the detection of the detecting unit to hold the articles to be transported so that the holding unit corrects and prevents a displacement of the stacked articles to be transported.

In this configuration, the detecting unit detects the articles to be transported. This controls the holding operation of the holding unit on the articles to be transported and allows the holding unit to correct and prevent a displacement of the stacked articles to be transported.

According to an invention described in a second aspect, in the transport device according to the first aspect, the holding unit comes into contact with the sides of the articles to be transported when holding the articles to be transported, correcting and preventing a displacement of the stacked articles to be transported.

In this configuration, the holding unit holds the articles to be transported. Further, the holding unit in contact with the sides of the articles to be transported corrects and prevents a displacement of the stacked articles to be transported while holding the articles to be transported.

According to an invention described in a third aspect, in the transport device according to the first or second aspect, the holding unit holds the articles to be transported while moving in a direction changing in stages relative to the articles to be transported.

In this configuration, the holding unit for holding the articles to be transported moves toward and away from the articles to be transported in a direction changing in stages relative to the articles to be transported.

According to an invention described in a fourth aspect, in the transport device according to any one of the first to third aspects, the detecting unit includes a first detecting unit that detects one side of the article to be transported and a second detecting unit that detects another side of the article to be transported.

In this configuration, the two detecting units (first and second detecting units) detect the articles to be transported in two directions.

According to an invention described in a fifth aspect, in the transport device according to any one of the first to fourth aspects, the article to be transported is a transport container for storing a work, and the holding unit holds the transport container so as to cover a storage port for the work in the transport container, preventing the work stored in the transport container from popping out of the transport container.

In this configuration, the holding unit holds the article to be transported. Further, the holding unit holding the article to be transported covers the storage port for the work, thereby preventing the work stored in the article to be transported from popping out of the article to be transported.

According to the transport device of the present invention, the holding unit that holds the articles to be transported corrects and prevents a displacement of the stacked articles to be transported, thereby eliminating the need for additionally providing a displacement correcting mechanism or a displacement preventing mechanism for the transport device or the articles to be transported. Thus, a displacement can be corrected and prevented with a simple device configuration, and the stacked articles to be transported can be sufficiently held (grasped). Even if a displacement correcting mechanism and a displacement preventing mechanism cannot be provided for the articles to be transported, the articles to be transported can be transported in a stacked state. Furthermore, this configuration eliminates the need for a securing member that secures the stacked articles to be transported so as to prevent a displacement of the stacked articles to be transported, leading to high working efficiency.

DETAILED DESCRIPTION OF THE PREFERRED EMBODIMENTS

An overhead carriage 10 will be first described below as an example of a transport device according to the present invention.

Figure 1:
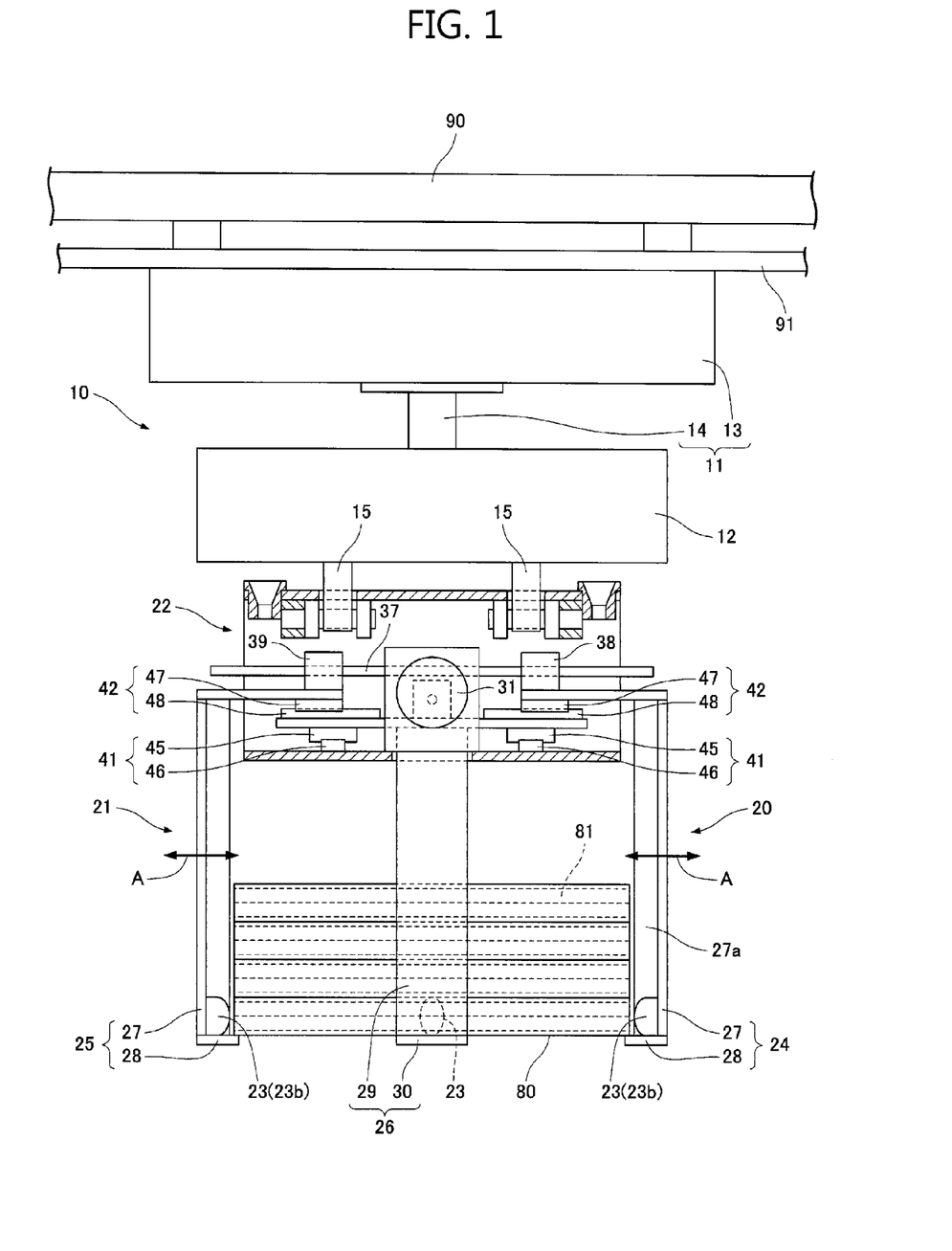
FIG. 1 is a front view showing an overhead carriage as an example of a transport device according to the present invention.

As shown in FIG. 1, the overhead carriage 10 transports works 81 such as a semiconductor substrate to a plurality of processing units (not shown) for performing predetermined processing on the works 81. The overhead carriage 10 holds a plurality of stacked trays 80 (an example of an "article to be transported") that accommodate the works 81 and transports the held trays 80.

Figure 2:
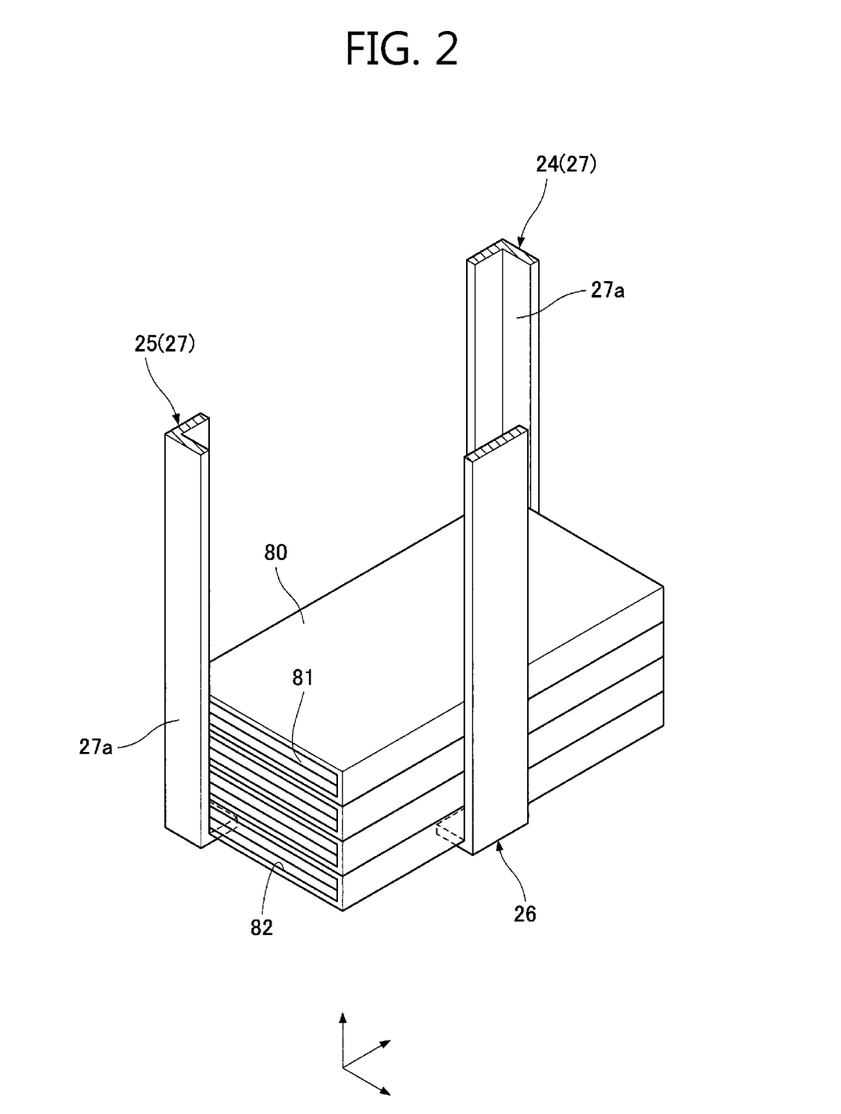
FIG. 2 is a perspective view showing a tray transported by the overhead carriage.

As shown in FIG. 2, the tray 80 transported by the overhead carriage 10 is a flat and hollow tray. The tray 80 can accommodate the multiple works 81 (two in FIG. 2). The tray 80 is configured to store the works 81 from storage ports 82 opened on two ends of the longitudinal direction of the tray 80.

[Overhead Carriage 10]

As shown in FIG. 1, the overhead carriage 10 is attached so as to be suspended from a traveling rail 91 provided near a facility ceiling 90. The overhead carriage 10 is movable along the traveling rail 91. The overhead carriage 10 is mainly composed of a mobile unit 11, an elevating unit 12, and a chucking device 20 (an example of a "holding device").

The mobile unit 11 is configured to travel along the traveling rail 91 firmly attached to the ceiling 90. The mobile unit 11 is mainly composed of a linear motor traveling body 13 that generates a traveling thrust for traveling along the traveling rail 91 and a support part 14 that is connected to the traveling body 13 so as to support the elevating unit 12. The traveling body 13 is not limited to a linear motor traveling body as long as the traveling body can travel in a space requiring cleanliness as in a clean room.

The elevating unit 12 elevates with the suspended chucking device 20. The elevating unit 12 is attached to the lower end of the mobile unit 11. The elevating unit 12 has a plurality of elevator belts 15. The elevating unit 12 is configured to simultaneously wind up and down the elevator belts 15. The elevator belts 15 are wound up and down such that the chucking device 20 is vertically moved substantially in a horizontal position while being suspended and supported by the elevator belts 15.

[Chucking Device 20]

The chucking device 20 holds the stacked trays 80. The chucking device 20 is attached to the elevating unit 12. The chucking device 20 holds the trays 80 so as to wrap around (pick up) the trays 80 from the bottom of the lowermost stacked tray 80. The chucking device 20 is mainly composed of a holding unit 21 for holding the trays 80, a driving unit 22 for driving the holding unit 21, and sensors 23 (an example of a "detecting unit") for detecting the trays 80.

[Holding Unit 21]

Figure 3:
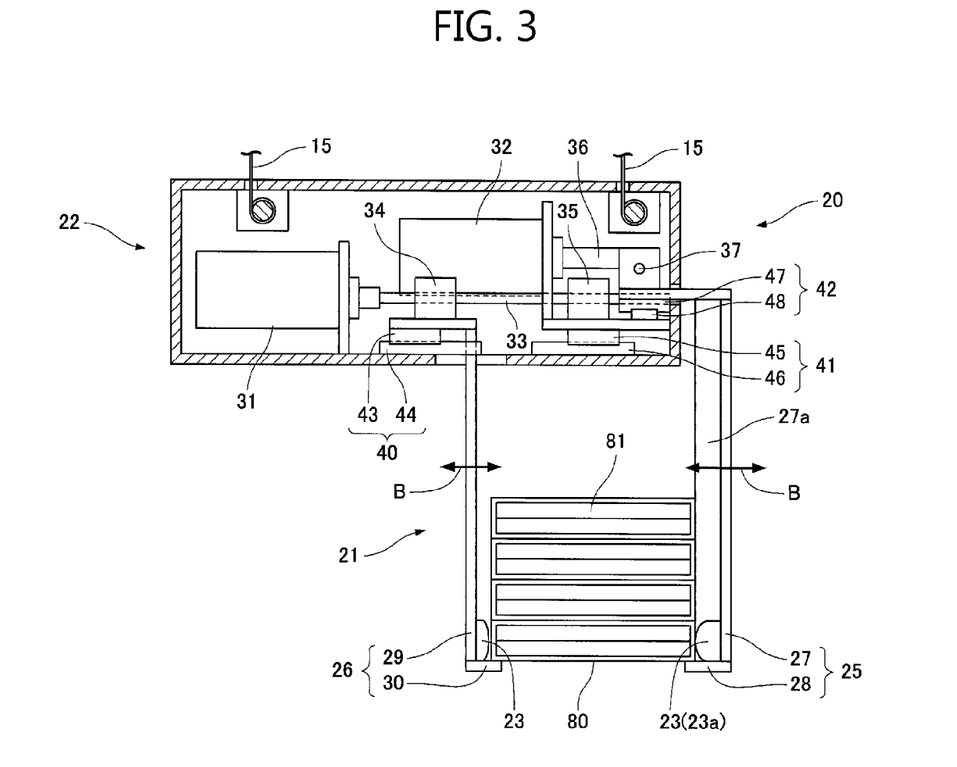
FIG. 3 is a side cross-sectional view showing a chucking device for the overhead carriage.

As shown in FIGS. 1 to 3, the holding unit 21 is extended in the vertical direction of the chucking device 20. The holding unit 21 portably holds the trays 80 from the bottom of the lowermost stacked tray 80 so as to wrap around (pick up) the trays 80. In other words, the holding unit 21 is a part for holding the trays 80. The holding unit 21 includes a plurality of (three in FIG. 1) chuck side members (chuck side members 24, 25, and 26) that are vertically extended. The holding unit 21 holds the trays 80 with the chuck side members. The holding unit 21 includes the three chuck side members (chuck side members 24, 25, and 26) that securely hold the weight of the trays 80 on the receiving portions (receiving portions 28 and 30) of the chuck side members (chuck side members 24, 25, and 26). Thus, the trays 80 can be held with higher stability.

The first chuck side member 24 and the second chuck side member 25 are square guide members that are disposed on the corners of the trays 80 when holding the trays 80. The first chuck side member 24 and the second chuck side member 25 come into contact with the sides of the stacked trays 80 so as to hold and guide the corners of the trays 80.

The first chuck side member 24 and the second chuck side member 25 each include an arm portion 27 that comes into contact with the corner of the tray 80 and the receiving portion 28 that is formed on one end of the arm portion 27 so as to receive the bottom of the lowermost tray 80.

The arm portion 27 is formed by joining two plate members 27a substantially in a substantially L shape according to the shape of the corner of the tray 80. The arm portions 27 come into contact with the corners of the trays 80 when the holding unit 21 holds the trays 80. When the arm portions 27 come into contact with the corners of the trays 80, the first chuck side member 24 and the second chuck side member 25 can hold the sides of the trays 80 with the third chuck side member 26. Moreover, the arm portions 27 in contact with the corners of the trays 80 can correct and prevent a displacement of the stacked trays 80.

Furthermore, the arm portion 27 in contact with the corner of the tray 80 vertically covers one end of the storage port 82 of the tray 80 (the storage port 82 of the tray 80 is partially closed). In other words, the arm portion 27 prevents the works 81 stored in the tray 80 from popping out of the storage port 82. Specifically, as shown in FIG. 2, one of the plate members 27a forming the arm portion 27 has a flat portion that covers one end of the opening of the storage port 82 on the tray 80 (the flat portion of the plate member 27a comes into contact with one end of the opening of the storage port 82). This reduces the size of the opening of the storage port 82 on the tray 80, allowing the flat portion of the plate member 27a to lock the works 81 that are likely to pop out of the storage port 82.

The arm portions 27 in contact with the corners of the trays 80 can press the works 81, which are likely to pop out of the storage ports 82, into the trays 80 so as to correct and prevent a displacement of the works 81 in the trays 80.

As has been discussed, the arm portions 27 of the first chuck side member 24 and the second chuck side member 25 have the function of holding the sides (corners) of the trays 80, the function of correcting and preventing a displacement of the stacked trays 80, and the function of preventing the works 81 stored in the trays 80 from popping out of the storage ports 82.

As shown in FIGS. 1 and 3, the receiving portion 28 is formed by joining a plate member, on which the bottom surface of the lowermost stacked tray 80 can be disposed, substantially perpendicular to one end face of the plate member 27a of the arm portion 27. When the holding unit 21 holds the trays 80, the receiving portion 28 comes into contact with the bottom surface of the corner of the lowermost stacked tray 80 so as to receive the trays 80.

The third chuck side member 26 is a face guide member that is disposed at the center of one of the side plates in the longitudinal direction of the tray 80 when the third chuck side member 26 holds the tray 80. In other words, the third chuck side member comes into contact with the sides of the stacked trays 80 so as to hold the side plates of the trays 80 and guide the side plates of the trays 80. Specifically, the third chuck side member 26 is disposed at the center of the side plate opposed to the side plate having the first chuck side member 24 and the second chuck side member 25 on the corners of the tray 80, the corners being located on two ends of the side plate. The third chuck side member 26 includes an arm portion 29 that comes into contact with the sides of the side plates of the trays 80 and the receiving portion 30 that is formed on one end of the arm portion 29 so as to receive the bottom surface of the lowermost stacked tray 80.

The arm portion 29 is composed of a plate member that can come into contact with the sides of the side plates of the trays 80. When the holding unit 21 holds the trays 80, the arm portion 29 comes into contact with the center of the side of one of the side plates of the tray 80 in the longitudinal direction of the tray 80. Thus, the third chuck side member 26 can hold the sides of the trays 80 along with the first chuck side member 24 and the second chuck side member 25. Furthermore, this configuration can correct and prevent a displacement of the stacked trays 80 in the width direction.

The receiving portion 30 is formed by joining a plate member, on which the bottom surface of the lowermost stacked tray 80 can be disposed, substantially perpendicularly to one end face of the plate member of the arm portion 29. When the holding unit 21 holds the trays 80, the receiving portion 30 comes into contact with the bottom surface of the center of one of the side plates of the lowermost stacked tray 80 in the longitudinal direction, receiving the trays 80.

[Driving Unit 22]

As shown in FIGS. 1 and 3, the driving unit 22 moves the chuck side members 24, 25, and 26 of the holding unit 21. The driving unit 22 is provided on the top of the holding unit 21. The driving unit 22 is mainly composed of motors 31 and 32 and slide members 40, 41, and 42.

The first motor 31 is a motor for moving the chuck side members 24, 25, and 26 perpendicularly (along arrows B in FIG. 3) to the longitudinal direction of the tray 80. The first motor 31 is connected to a first shaft 33. The first motor 31 is operated so as to rotate the first shaft 33.

The first shaft 33 is composed of a ball screw. The first shaft 33 is reversely threaded at portions where a first nut member 34 and a second nut member 35 are inserted onto the first shaft 33. In other words, the first shaft 33 is formed such that the first nut member 34 and the second nut member 35 move closely toward and away from each other on the first shaft 33 when the first shaft 33 is rotated.

The second motor 32 is a motor for moving the first chuck side member 24 and the second chuck side member 25 in the longitudinal direction of the tray 80 (along arrows A in FIG. 1). The second motor 32 is connected to a second shaft 36. The second motor 32 is operated so as to rotate the second shaft 36.

The second shaft 36 is connected to a third shaft 37. The second shaft 36 is rotated so as to rotate the third shaft 37.

The third shaft 37 is composed of a ball screw. The third shaft 37 is reversely threaded at portions where a third nut member 38 and a fourth nut member 39 are inserted onto the third shaft 37. In other words, the third shaft 37 is formed such that the third nut member 38 and the fourth nut member 39 move closely toward and away from each other on the third shaft 37 when the third shaft 37 is rotated.

The first slide member 40 is a member for moving the third chuck side member 26 perpendicularly (along the arrows B in FIG. 3) to the longitudinal direction of the tray 80. The first slide member 40 includes a first guide 43 that supports the third chuck side member 26 and a first guide rail 44 that slides the first guide 43.

The second slide member 41 is a member for moving the first chuck side member 24 or the second chuck side member 25 perpendicularly (along the arrows B in FIG. 3) to the longitudinal direction of the tray 80. The second slide member 41 includes a second guide 45 that supports the first chuck side member 24 or the second chuck side member 25 and a second guide rail 46 that guides the second guide 45.

The third slide member 42 is a member for moving the first chuck side member 24 or the second chuck side member 25 in the longitudinal direction (along the arrows A in FIG. 1) of the tray 80. The third slide member 42 includes a third guide 47 that supports the first chuck side member 24 or the second chuck side member 25 and a third guide rail 48 that slides the third guide 47.

In the overhead carriage 10, the third slide member 42 is disposed on the top of the second slide member 41, in other words, the two slide members are vertically disposed in the driving unit 22. This configuration allows the first chuck side member 24 and the second chuck side member 25 to move in two directions (the arrows A in FIG. 1 and the arrows B in FIG. 3).

[Sensor 23]

As shown in FIGS. 1 and 3, the sensors 23 are provided on the lower ends of the chuck side members 24, 25, and 26 (near the receiving portions 28). The sensors 23 detect the trays 80 held by the holding unit 21. The detection result of the sensor 23 is transmitted as a detection signal to a control unit (not shown). The control unit controls the holding operations of the chuck side members 24, 25, and 26 on the trays 80 in response to the detection signals from the sensors 23.

The sensor 23 is composed of a capacitance proximity sensor. The sensor 23 is not limited to a capacitance sensor. Since the sensor type may be selected depending on the material, color, and so on of the tray 80, the sensor 23 may be, for example, an optical or direct-contact sensor. The sensors 23 provided on the lower ends of the chuck side members 24, 25, and 26 are not limited to this configuration. The sensors 23 may be provided at, for example, the centers or the upper ends of the chuck side members 24, 25, and 26 as long as the stacked trays 80 can be detected.

Moreover, each of the sensors 23 provided on the lower ends of the first chuck side member 24 and the second chuck side member 25 includes a first sensor 23a (an example of a "first detecting unit") that detects one of the wall boards of the tray 80 (a wall board formed in the longitudinal direction of the tray 80) and a second sensor 23b (an example of a "second detecting unit") that detects a wall board formed perpendicularly to the wall board detected by the first sensor 23a (a wall board formed perpendicularly to the longitudinal direction of the tray 80). In other words, the first chuck side member 24 and the second chuck side member 25 includes the two sensors that detect different positions (directions of detection) of the tray 80 so as to detect the tray 80 in two different directions.

When the first chuck side member 24 and the second chuck side member 25 are moved perpendicularly (along the arrows B in FIG. 3) to the longitudinal direction of the tray 80, the first sensor 23a detects the wall board formed in the longitudinal direction of the tray 80.

When the first chuck side member 24 and the second chuck side member 25 are moved in the longitudinal direction of the tray 80 (along the arrows A in FIG. 1), the second sensor 23b detects the wall board formed perpendicularly to the longitudinal direction of the tray 80.

Each of the sensors 23 provided on the lower ends of the first chuck side member 24 and the second chuck side member 25 includes the two sensors (the first sensor 23a and the second sensor 23b). The sensor 23 is not limited to this configuration. The sensor 23 may be composed of a single sensor as long as the stacked trays 80 can be detected according to the movements of the first chuck side member 24 and the second chuck side member 25.

[The Holding Operations of the Chuck Side Members 24, 25, and 26]

The holding operations of the chuck side members 24, 25, and 26 will be described below.

Figures 4A, 4B, 4C:
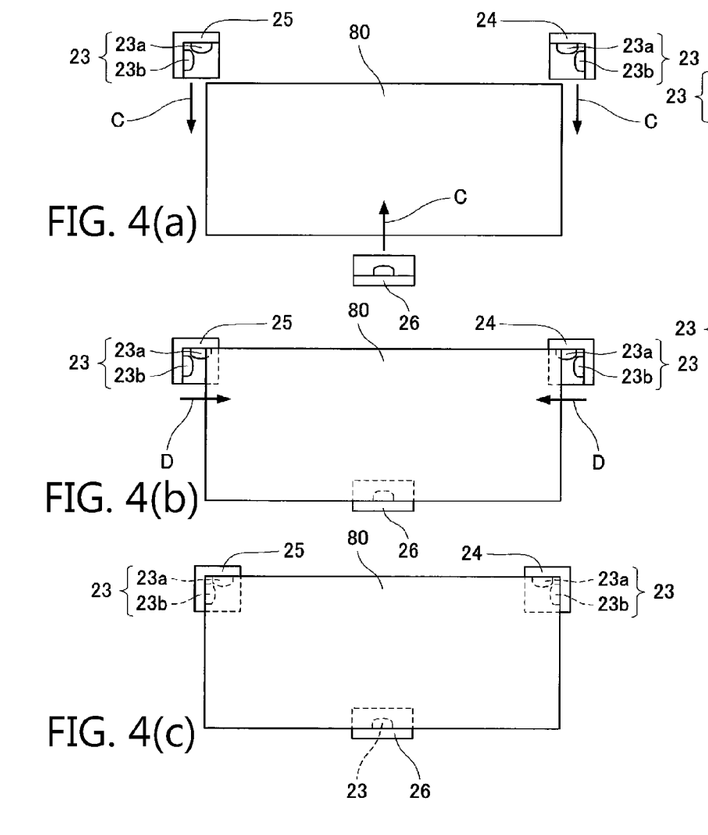
FIGS. 4(a) to 4(c) are plan schematic diagrams showing that a first chuck side member and a second chuck side member for the overhead carriage are moved in two steps.
Figures 4D, 4E:
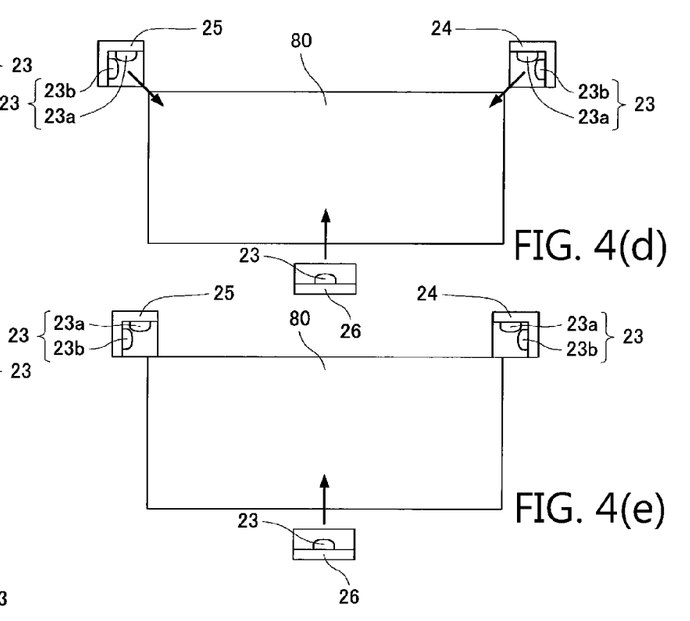
FIGS. 4(d) and 4(e) are plan schematic diagrams showing that the first chuck side member and the second chuck side member for the overhead carriage are moved in one step.

As shown in FIG. 4(a), in the overhead carriage 10, the chuck side members 24, 25, and 26 first move perpendicularly to the longitudinal direction of the stacked trays 80 (along arrows C and the width of the trays 80). Subsequently, the chuck side members 24, 25, and 26 hold the longitudinal side plates of the tray 80. After that, as shown in FIG. 4(b), the first chuck side member 24 and the second chuck side member 25 move in the longitudinal direction of the tray 80 (along arrows D). The first chuck side member 24 and the second chuck side member 25 then hold side plates provided along the width of the tray 80. In other words, in the overhead carriage 10, the first chuck side member 24 and the second chuck side member 25 hold the corners of the tray 80 while changing the moving directions in two ways with respect to the tray 80. This is because if the first chuck side member 24 and the second chuck side member 25 are moved in one step according to the movement of the third chuck side member 26 as shown in FIG. 4(d), the first chuck side member 24 and the second chuck side member 25 may be caught by the tray 80 depending on the shape or size of the tray 80, thereby preventing holding of the tray 80 (See FIG. 4(e)). Since the first chuck side member 24 and the second chuck side member 25 are moved in two steps, even the trays 80 varying in shape or size can be held by the holding unit 21 without the chuck side members 24, 25, and 26 being caught by the trays 80. These operations will be specifically described below.

As shown in FIG. 3, when the first motor 31 is started, the first shaft 33 is rotated so as to move the first nut member 34 toward the center of the first shaft 33. The movement of the first nut member 34 allows the first guide 43 of the first slide member 40 fixed to the first nut member 34 to slide along the first guide rail 44. Thus, the third chuck side member 26 supported by the first guide 43 moves closely toward the tray 80 (so as to hold the side plates of the tray 80) perpendicularly to the longitudinal direction of the tray 80 (along the arrows B and the width of the tray 80 in FIG. 3).

At the same time, the first motor 31 is started to rotate the first shaft 33. At this point, the second nut member 35 moves to the center of the first shaft 33. The movement of the second nut member 35 allows the second guide 45 of the second slide member 41 fixed to the second nut member 35 to slide along the second guide rail 46. Thus, the first chuck side member 24 and the second chuck side member 25 that are supported by the second guide 45 move closely toward the tray 80 along the width of the tray 80 (along the arrows B in FIG. 3). The second motor 32 also moves along the width of the tray 80 (along the arrows B in FIG. 3) in response to the sliding of the second guide 45.

When the first motor 31 is started to move the chuck side members 24, 25, and 26 toward the tray 80, the sensor 23 (first sensor 23a) provided on each of the chuck side members 24, 25, and 26 detects the presence or absence of the tray 80. Specifically, a distance between each of the chuck side members 24, 25, and 26 and the tray 80 is detected from the detection result of the sensor 23. The sensor 23 transmits the detection result as the detection signal to the control unit (not shown). The control unit determines a distance (positional relationship) between each of the chuck side members 24, 25, and 26 and the tray 80 based on the detection signal from the sensor 23. Moreover, the control unit controls the activation of the first motor 31 so as to control the movements of the chuck side members 24, 25, and 26. When the sensor 23 detects the tray 80 at a predetermined position, specifically, a contact position between each of the chuck side members 24, 25, and 26 and the wall board of the tray 80, the control unit stops driving the first motor 31 to stop the movements of the chuck side members 24, 25, and 26.

Subsequently, as shown in FIGS. 1 and 3, the second motor 32 is started to rotate the second shaft 36 and then the third shaft 37. The rotation of the third shaft 37 moves the third nut member 38 and the fourth nut member 39 toward the center of the third shaft 37 so as to come close to each other. Subsequently, the third guides 47 of the third slide members 42, to which the third nut member 38 and the fourth nut member 39 are fixed, slide along the third guide rails 48. This allows the first chuck side member 24 and the second chuck side member 25 to move in the longitudinal direction of the tray 80 (along the arrows B in FIG. 1) so as to come close to each other, holding the corners of the tray 80.

When the second motor 32 is started to move the first chuck side member 24 and the second chuck side member 25 toward the tray 80, the sensor 23 (second sensor 23b) provided on each of the first chuck side member 24 and the second chuck side member 25 detects the tray 80 and transmits the detection result as the detection signal to the control unit (not shown). The control unit determines a distance (positional relationship) between each of the first and second chuck side members 24 and 25 and the tray 80 based on the detection signal from the sensor 23 (second sensor 23b). Moreover, the control unit controls the activation of the second motor 32 so as to control the movements of the first and second chuck side members 24 and 25. When the sensor 23 (second sensor 23b) detects the tray 80 at a predetermined position, specifically, a contact position between each of the first and second chuck side members 24 and 25 and the wall board of the tray 80, the control unit stops driving the second motor 32 to stop the movements of the first and second chuck side members 24 and 25.

As has been discussed, in the overhead carriage 10, the sensor 23 provided on each of the chuck side members 24, 25, and 26 detects a distance between each of the chuck side members 24, 25, and 26 and the tray 80; meanwhile, the movements of the chuck side members 24, 25, and 26 are controlled. This can freely change positions where the chuck side members 24, 25, and 26 hold the tray 80, according to the shape or size of the tray 80. Thus, even if the trays 80 having different shapes and sizes are transported when necessary, the chuck side members 24, 25, and 26 can be moved according to the shapes or sizes of the trays 80. This does not need to change the structure of the overhead carriage 10 (e.g., the structures of the chuck side members 24, 25, and 26) according to the shape or size of the tray 80. The trays 80 varying in shape or size can be transported only by changing the positions where the chuck side members 24, 25, and 26 hold the tray 80 in the same device structure.

In the overhead carriage 10, the chuck side members 24, 25, and 26 in contact with the sides (corners) of the stacked trays 80 hold the trays 80, thereby preventing a displacement of the stacked trays 80. Even if articles to be transported cannot be additionally provided with displacement preventing mechanisms, the articles to be transported can be transported in a stacked state.

Moreover, in the overhead carriage 10, the first chuck side member 24 and the second chuck side member 25 that hold the trays 80 can prevent the works 81 from popping out of the trays 80. Such a simple device configuration can prevent the works 81 from popping out of the trays 80.

Furthermore, in the overhead carriage 10, the tray 80 is detected by the two sensors (the first sensor 23a and the second sensor 23b) that detect the tray 80 at different positions; meanwhile, the moving directions of the first chuck side member 24 and the second chuck side member 25 relative to the tray 80 are changed in stages, allowing the first chuck side member 24 and the second chuck side member 25 to hold the tray 80 without being caught by the tray 80.

[Correction of a Displacement of the Stacked Trays 80]

Correction of a displacement of the stacked trays 80 in the overhead carriage 10 will be described below.

Figure 5A:
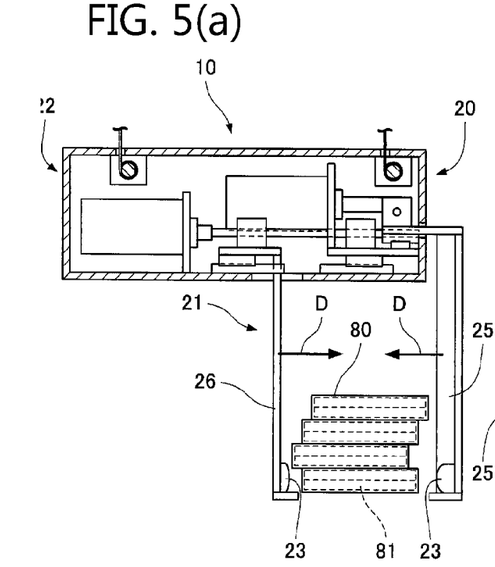
FIG. 5(a) is a side cross-sectional view showing the overhead carriage during transportation of stacked trays.
Figures 5B, 5E:
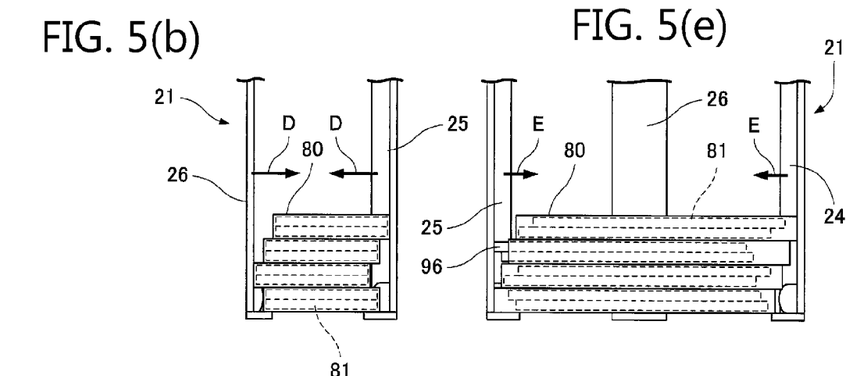
FIGS. 5(b) and (c) are side views near a holding unit for the overhead carriage during the transportation of the stacked trays.
FIGS. 5(e) and (f) are front views near the holding unit for the overhead carriage during the transportation of the stacked trays.
Figures 5C, 5F:
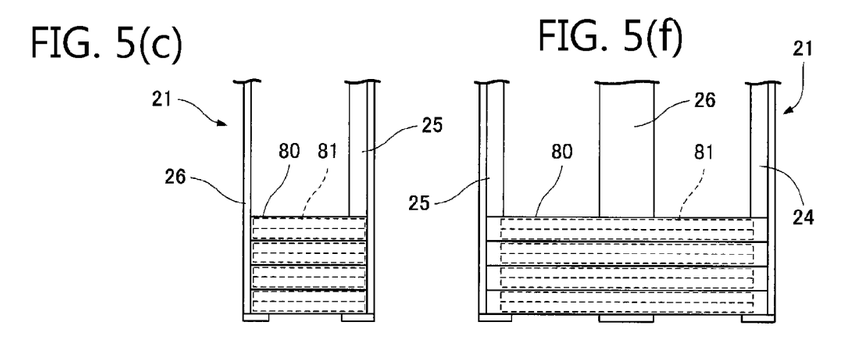
Figure 5D:
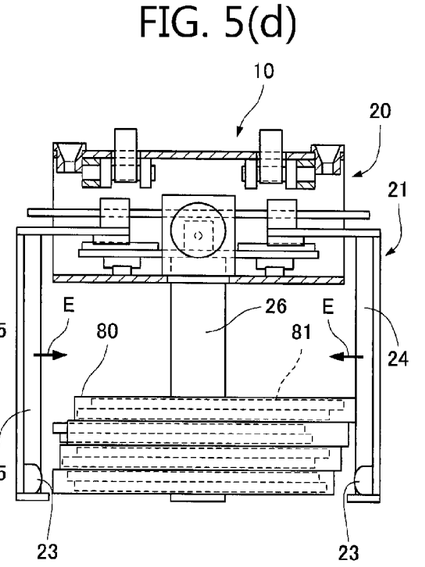
FIG. 5(d) is a front cross-sectional view showing the overhead carriage during the transportation of the stacked trays.

As shown in FIGS. 5(a) and 5(d), the trays 80 transported by the overhead carriage 10 may be stacked while being displaced in the longitudinal direction or the width direction (perpendicularly to the longitudinal direction). In this case, as shown in FIG. 5(a), the chuck side members 24, 25, and 26 are first moved in the width direction (along the arrows D) of the tray 80, thereby correcting a displacement of the trays 80 in the width direction of the tray 80. Specifically, as shown in FIG. 5(b), the chuck side members 24, 25, and 26 in contact with the longitudinal sides of the trays 80 are moved along the arrows D. This presses the displaced trays 80 along the arrows D so as to correct a displacement in the width direction of the stacked trays 80.

Subsequently, as shown in FIG. 5(d), the first chuck side member 24 and the second chuck side member 25 are moved in the longitudinal direction of the tray 80 (along arrows E) so as to correct a displacement in the longitudinal direction of the tray 80. Specifically, as shown in FIG. 5(e), the first chuck side member 24 and the second chuck side member 25 in contact with the sides of the trays 80 in the width direction are moved along the arrows E. This presses the displaced trays 80 along the arrows E so as to correct a displacement of the stacked trays 80 in the longitudinal direction.

As shown in FIG. 5(d), some of the stacked trays 80 may contain the works 81 popping out of the trays 80, the works 81 being to be stored in the trays 80. Thus, in the overhead carriage 10, the first chuck side member 24 and the second chuck side member 25 are moved in the longitudinal direction of the tray 80 (along the arrows E), thereby correcting a displacement of the works 81 popping out of the trays 80. Specifically, as shown in FIG. 5(e), the first chuck side member 24 and the second chuck side member 25 in contact with the sides of the works 81 popping out of the trays 80 are moved along the arrows E. Thus, the works 81 popping out of the trays 80 are pressed along the arrows E so as to be stored in the trays 80.

In this way, in the overhead carriage 10, the trays 80 are held by the chuck side members 24, 25, and 26 in contact with the sides of the trays 80 and the works 81, thereby correcting a displacement of the trays 80 and the works 81. In other words, the chuck side members 24, 25, and 26 have the function of holding the trays 80 and the function of correcting a displacement of the trays 80 and the works 81. Thus, the overhead carriage 10 does not need to have a displacement correcting mechanism on the overhead carriage 10, thereby correcting a displacement of the trays 80 and the works 81 with a simple device configuration.

As has been discussed, in the overhead carriage 10, the chuck side members 24, 25, and 26 that hold the trays 80 correct and prevent a displacement of the stacked trays 80. Thus, a displacement correcting mechanism and a displacement preventing mechanism do not need to be provided on the overhead carriage 10 or the tray 80. Such a simple device configuration can correct and prevent a displacement and sufficiently hold (grasp) the stacked trays 80. Even if a displacement correcting mechanism and a displacement preventing mechanism cannot be additionally provided for the trays 80, the stacked trays 80 can be transported. Furthermore, this configuration eliminates the need for a securing member that secures the stacked trays 80 so as to prevent a displacement of the stacked trays 80, leading to high working efficiency.

Figure 6A:
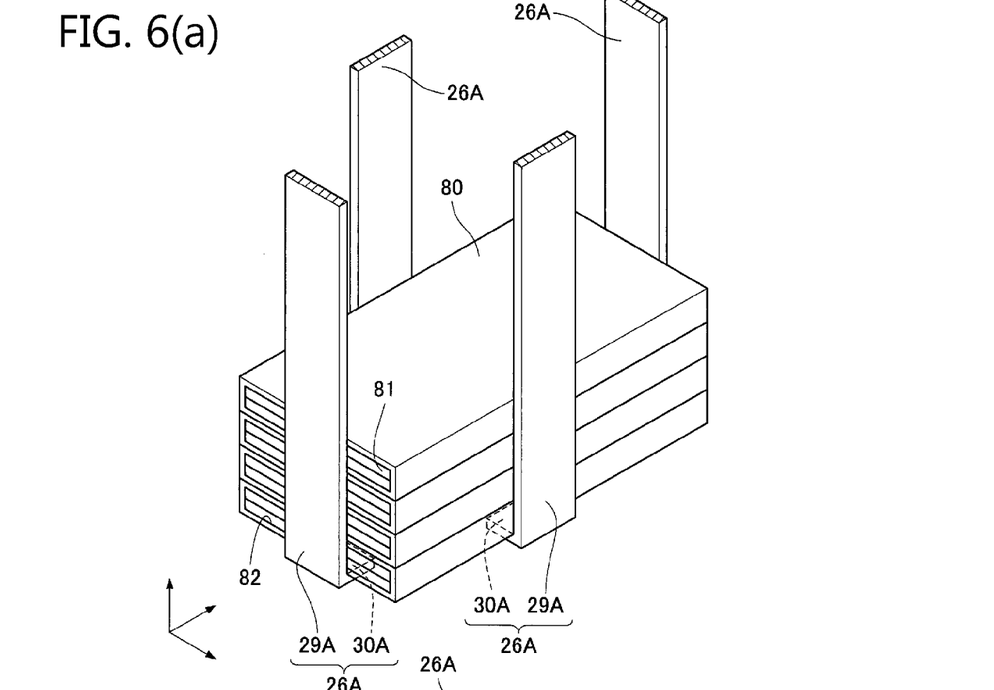
FIG. 6(a) is a perspective view showing another example of the holding unit of the overhead carriage.

In the overhead carriage 10, the holding unit 21 includes, but not exclusively, the three chuck side members (chuck side members 24, 25, and 26). As shown in FIG. 6, four surface-guide side members 26A may hold the centers portions of the side plates of the trays 80. In this configuration, like the third chuck side member 26, the surface-guide side member 26A includes an arm portion 29A composed of a plate member that can come into contact with the side of the side plate of the tray 80 and a receiving portion 30A formed by joining a plate member, on which the bottom surface of the lowermost stacked tray 80 can be placed, substantially perpendicularly to one end face of the plate member of the arm portion 29A.

Figure 6B:
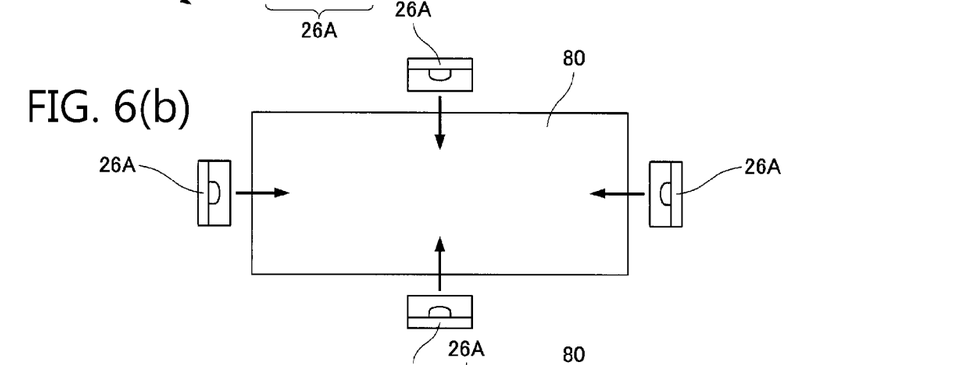
FIGS. 6(b) and 6(c) are plan schematic views when face guide members are moved relative to the trays in the holding unit according to the example.
Figure 6C:
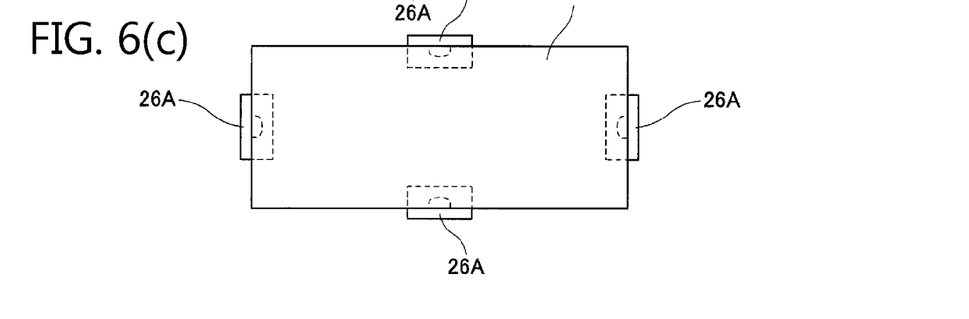

In this case, as shown in FIGS. 6(*b*) and 6(*c*), the four surface-guide side members 26A are simultaneously (in one step) moved closely toward the tray 80 so as to hold the centers of the side plates of the tray 80.

In this case, as shown in FIG. 6(*a*), the arm portions 29A of the surface-guide side members 26A come into contact with the sides of the tray 80 so as to correct and prevent a displacement of the stacked trays 80. Furthermore, the arm portion 29A vertically covers the centers of the storage ports 82 of the trays 80 (closes the centers of the storage ports 82 of the trays 80) so as to prevent the works 81 stored in the trays 80 from popping out of the storage ports 82.

Furthermore, in the present embodiment, the transport device is the overhead carriage 10 that travels on a ceiling. The transport device is not limited to the overhead carriage 10. For example, the transport device may include the chucking device 20 on a vehicle body that travels on a floor. In this case, the chucking device 20 is attached to an arm member vertically pivotally mounted on a rotary table rotatably provided on the vehicle body.

Furthermore, in the present embodiment, the chuck side members 24, 25, and 26 of the holding unit 21 are moved by a configuration like the driving unit 22 (including the motors 31 and 32 and the slide members 40, 41, and 42). The driving unit is not limited to this configuration.

Having described the invention, the following is claimed:

1. A transport device for transporting articles in a stacked state, the transport device comprising:
   a holding device comprising a holding unit and a detecting unit, the holding unit being configured to hold the stacked articles during a transport thereof, the holding unit comprising a chuck side member configured to hold the stacked articles from a bottom of a lowermost one of the stacked articles so as to wrap around the stacked articles, the detecting unit being configured to detect a distance between the chuck side member and the stacked articles, the chuck side member comprising an arm portion that is moveable across the distance to place the arm portion in contact with sides of the stacked articles,
   wherein the stacked articles are stacked transport containers for storing works, and
   wherein the arm portion comes into contact with ends of storage ports of the stacked transport containers, the storage ports being configured to hold the works therein.

2. The transport device according to claim 1, wherein the chuck side member corrects and prevents a displacement of the stacked articles.

3. The transport device according to claim 1, wherein the chuck side member is moveable in a direction changing in stages relative to the stacked articles while holding the stacked articles.

4. The transport device according to claim 1, wherein the detecting unit includes a first detecting unit that detects one side of the stacked articles and a second detecting unit that detects another side of the stacked articles.

\* \* \* \* \*